(12) United States Patent
Boliek et al.

(10) Patent No.: US 11,417,663 B2
(45) Date of Patent: *Aug. 16, 2022

(54) SYSTEM AND METHOD FOR DATA COLLECTION AND EXCHANGE WITH PROTECTED MEMORY DEVICES

(71) Applicant: MO-DV, INC., Campbell, CA (US)

(72) Inventors: Martin Boliek, San Francisco, CA (US); Robert D. Widergren, Campbell, CA (US); Wayne Hossenlopp, Los Gatos, CA (US)

(73) Assignee: MO-DV, INC., Campbell, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/734,157

(22) Filed: Jan. 3, 2020

(65) Prior Publication Data

US 2020/0251475 A1    Aug. 6, 2020

Related U.S. Application Data

(63) Continuation of application No. 14/937,056, filed on Nov. 10, 2015, now Pat. No. 9,634,011.

(51) Int. Cl.
*H01L 27/108* (2006.01)
*H01L 29/423* (2006.01)
(Continued)

(52) U.S. Cl.
CPC .. *H01L 27/10823* (2013.01); *H01L 21/02164* (2013.01); *H01L 21/823418* (2013.01);
(Continued)

(58) Field of Classification Search
CPC .... G06F 9/4843; G06F 3/0623; G06F 3/0643; G06F 3/0679; G06F 21/602; G06F 21/6218; G06F 2209/482; H04L 63/0442
See application file for complete search history.

(56) References Cited

U.S. PATENT DOCUMENTS 7,508,943 B2    3/2009  Widergren
7,599,890 B2   10/2009  Hori ...................... H04L 9/0825
                                                340/7.21
(Continued)

OTHER PUBLICATIONS

PCT International Search Report for related PCT Patent Application No. PCT/US2011/066541, dated Jul. 30, 2012, 5 pgs.
(Continued)

*Primary Examiner* — Nicholas R Taylor
*Assistant Examiner* — Kidest Mendaye
(74) *Attorney, Agent, or Firm* — Womble Bond Dickinson (US) LLP

(57) ABSTRACT

A method, apparatus, and article of manufacture for collecting and exchanging data are disclosed. In one embodiment, the apparatus comprises a non-volatile memory device, which includes an interface for coupling the non-volatile memory device to a host system; non-volatile memory for storing data, including a plurality of executables at least two of which are executable on different operating systems or devices. The plurality of executables includes a data collection executable and a data transfer executable. The nonvolatile memory device also includes a controller to cause execution of at least one executable in the plurality of executables, including the data collection executable and the data transfer executable, where execution of the data collection executable causes data to be collected and stored in the non-volatile memory, and execution of which causes the collected data to be transferred to a location external to the non-volatile memory device.

19 Claims, 7 Drawing Sheets

(51) Int. Cl.
*H01L 29/51* (2006.01)
*H01L 29/49* (2006.01)
*H01L 29/66* (2006.01)
*H01L 21/02* (2006.01)
*H01L 21/8234* (2006.01)
*H01L 29/417* (2006.01)

(52) U.S. Cl.
CPC .. *H01L 27/10814* (2013.01); *H01L 27/10876* (2013.01); *H01L 27/10891* (2013.01); *H01L 29/41783* (2013.01); *H01L 29/4236* (2013.01); *H01L 29/4958* (2013.01); *H01L 29/4966* (2013.01); *H01L 29/511* (2013.01); *H01L 29/513* (2013.01); *H01L 29/517* (2013.01); *H01L 29/66621* (2013.01); *H01L 29/66628* (2013.01); *H01L 21/02175* (2013.01); *H01L 21/02178* (2013.01); *H01L 21/02181* (2013.01); *H01L 21/02186* (2013.01); *H01L 21/02189* (2013.01)

(56) References Cited

U.S. PATENT DOCUMENTS

| | | | | |
|---|---|---|---|---|
| 7,953,985 | B2 | 5/2011 | Nishimura | G06Q 20/341 711/100 |
| 8,751,795 | B2 | 6/2014 | Widergren et al. | |
| 9,183,045 | B2 | 11/2015 | Boliek et al. | |
| 9,647,992 | B2 | 5/2017 | Widergren et al. | |
| 10,148,625 | B2 | 12/2018 | Widergren et al. | |
| 2002/0023143 | A1* | 2/2002 | Stephenson | H04L 63/061 709/218 |
| 2002/0070272 | A1 | 6/2002 | Gressel | G06F 21/57 235/382 |
| 2003/0033567 | A1 | 2/2003 | Tamura et al. | |
| 2003/0105924 | A1* | 6/2003 | Spencer | G06Q 20/145 711/115 |
| 2003/0147297 | A1 | 8/2003 | Shiota et al. | |
| 2004/0006588 | A1* | 1/2004 | Jessen | G06Q 10/107 709/202 |
| 2004/0228169 | A1 | 11/2004 | Widergren | |
| 2005/0013293 | A1* | 1/2005 | Sahita | H04L 43/028 370/389 |
| 2005/0190616 | A1 | 9/2005 | Widergren et al. | |
| 2006/0168445 | A1 | 7/2006 | Pitsos | 713/162 |
| 2006/0212836 | A1* | 9/2006 | Khushraj | G06F 16/954 715/866 |
| 2006/0294513 | A1 | 12/2006 | Bar-El et al. | |
| 2007/0136541 | A1 | 6/2007 | Herz et al. | 711/162 |
| 2007/0192833 | A1 | 8/2007 | Ho et al. | 726/3 |
| 2008/0016196 | A1 | 1/2008 | MacMillan et al. | 709/223 |
| 2008/0040748 | A1* | 2/2008 | Miyaki | G11B 27/036 725/46 |
| 2008/0123863 | A1 | 5/2008 | Bade | G06F 21/6209 380/282 |
| 2008/0288106 | A1 | 11/2008 | Widergren et al. | |
| 2009/0048994 | A1* | 2/2009 | Applebaum | G06F 16/24573 706/45 |
| 2009/0063185 | A1* | 3/2009 | Chang | G16H 10/60 705/2 |
| 2009/0123131 | A1* | 5/2009 | Morioka | H04L 65/4076 386/241 |
| 2009/0164522 | A1* | 6/2009 | Fahey | H04L 63/30 |
| 2009/0164529 | A1* | 6/2009 | McCain | G06F 11/1464 |
| 2009/0169004 | A1 | 7/2009 | Widergren | |
| 2010/0070447 | A1* | 3/2010 | Pfuntner | G06F 11/3006 706/47 |
| 2010/0146269 | A1* | 6/2010 | Baskaran | G06F 21/10 713/165 |
| 2010/0191850 | A1 | 7/2010 | Tonnesen | 709/224 |
| 2011/0106942 | A1* | 5/2011 | Roskowski | H04L 43/12 709/224 |

OTHER PUBLICATIONS

PCT Written Opinion of the International Searching Authority for related PCT Patent Application No. PCT/US2011/066541, dated Jul. 30, 2012, 4 pgs.

International Search Report for PCT Patent Application No. PCT/US2011/066541, dated Jul. 30, 2012, 5 pages.

Written Opinion of the International Searching Authority for PCT Patent Application No. PCT/US2011/066541, dated Jul. 30, 2012, 4 pages.

\* cited by examiner

SYSTEM AND METHOD FOR DATA COLLECTION AND EXCHANGE WITH PROTECTED MEMORY DEVICES

PRIORITY

This application is a continuation of U.S. application Ser. No. 14/937,205, filed Nov. 10, 2015, now U.S. Pat. No. 10,558,811, issued Feb. 11, 2020, which is a continuation of U.S. application Ser. No. 12/975,056, filed Dec. 21, 2010, now U.S. Pat. No. 9,183,045, issued Nov. 10, 2015, which is incorporated herein by reference in its entirety.

RELATED APPLICATIONS

This application is related to U.S. patent application Ser. No. 12/184,483, filed Aug. 1, 2008, U.S. Patent Application No. 61/221,029, filed Jun. 22, 2009, and U.S. Patent Application No. 61/382,877, filed Sep. 14, 2010, all of which are incorporated by reference herein in their entirety.

TECHNICAL FIELD

The disclosed embodiments relate generally to acquiring, aggregating, and securely transferring to authenticated targets user, incidental and analytical data.

BACKGROUND

Multimedia memory cards, Smart Cards, USB flash drives, and other storage card formats are well known today as a means of providing external memory capacity for storing information. Such cards are typically used in portable devices such as cellular phones, personal digital assistants, digital cameras, etc. to store data. Furthermore, these devices can be connected to, and exchange data with, other devices such as personal computers, televisions, projectors, and a host of new smart devices and appliances. These memory cards are traditionally just peripheral memory devices without computational or executable capabilities. There is no way to know where or how these memory cards have been used, what data was exchanged, where that data has propagated, or other characteristics of the usage.

SUMMARY

A method, apparatus, and article of manufacture for collecting and exchanging data are disclosed. In one embodiment, the apparatus comprises a non-volatile memory device, which includes an interface for coupling the non-volatile memory device to a host system; non-volatile memory for storing data, including a plurality of executables at least two of which are executable on different operating systems or devices. The plurality of executables includes a data collection executable and a data transfer executable. The non-volatile memory device also includes a controller to cause execution of at least one executable in the plurality of executables, including the data collection executable and the data transfer executable, where execution of the data collection executable causes data to be collected and stored in the non-volatile memory, and execution of which causes the collected data to be transferred to a location external to the non-volatile memory device.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

Like reference numerals refer to corresponding parts throughout the drawings.

DETAILED DESCRIPTION

Figure 1:
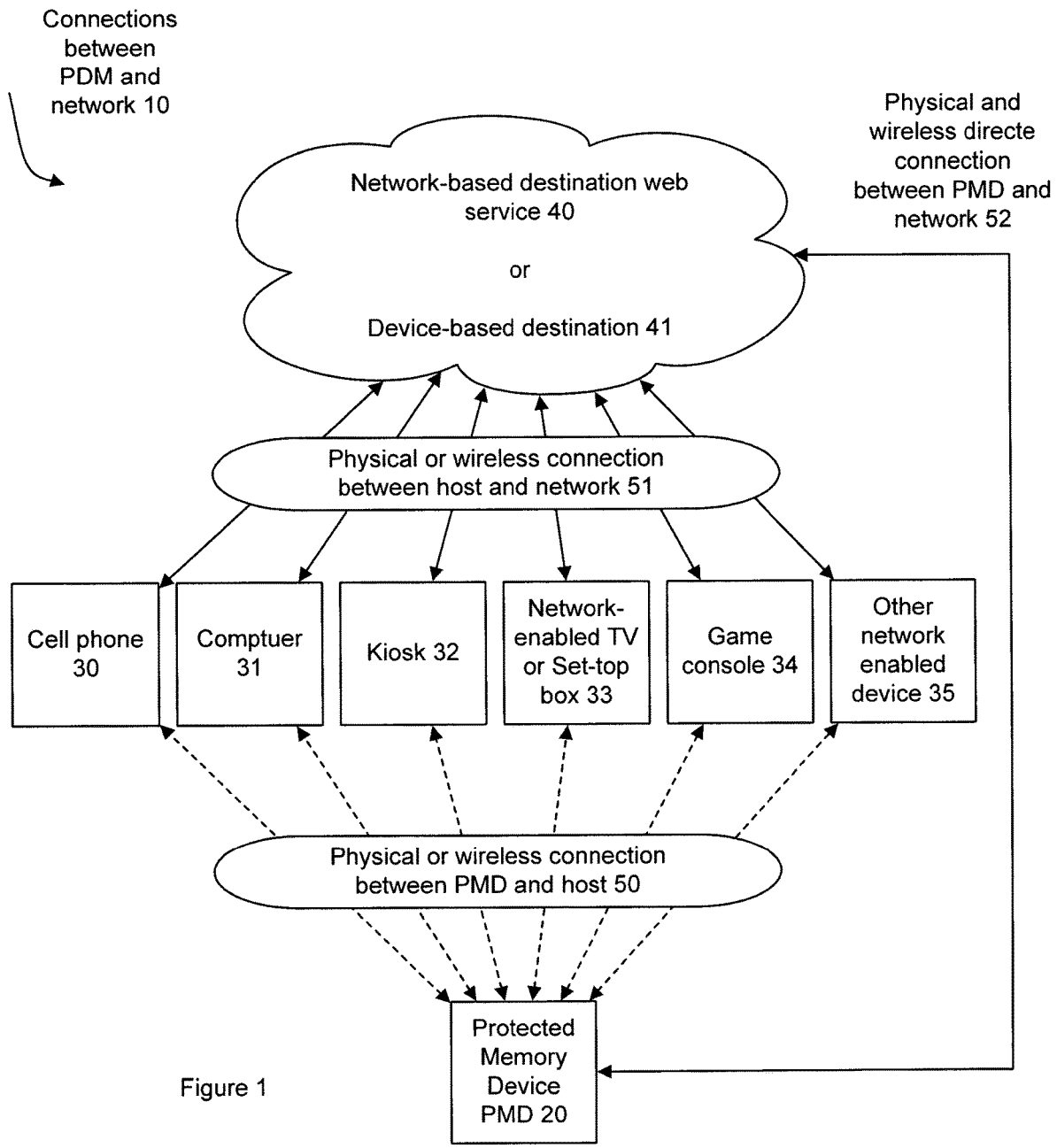
FIG. 1 illustrates one embodiment of system network connections and data flow between a PMD, a host, and a network web service or target device.

Embodiments of the present invention overcome the limitations and disadvantages described above by providing methods, systems, and executable programs for acquiring, aggregating, and securely transferring data. In one embodiment, the data is transferred to an appropriate authenticated destination.

Embodiments of memory devices that have executable programs, protocols, communication interfaces, and, in some cases, computation capabilities, are used to securely collect analytical and user data, manage that data, log the stored content and interactions, and exchange that data with the other devices and/or locations. These devices may be stand-alone devices, peripheral devices connected to other devices (e.g., mobile phones, computers, kiosks, TV's and set-top boxes), or embedded inside other devices. These devices are referred to herein as Protected Memory Devices (PMD) is the PMD described in U.S. Patent Application No. 61/382,877, which is incorporated herein by reference.

Multiple embodiments are described herein that involve executables or other program code, which when executed, acquire data directly from user actions such as from the action of requesting a file transfer, from executable programs such as a multimedia player or game, and from analytical programs running in the background or in parallel to other programs. In one embodiment, this occurs without user input specifying the process to begin. That is, the process may be started without user knowledge.

In one embodiment, the data is encrypted and aggregated according to the function and destination. In one embodiment, one or more symmetric encryption keys (e.g., AES, DES) or public/private key pairs are used to encrypt the data. In one embodiment, symmetric keys are included in a data header, which is then encrypted with the public key of a web service or other destination or device for which the data is targeted. In one embodiment, a file format is used in which this public key, or other identifier, is used to determine the destination and direct the data transfer.

Embodiments are presented for securely transferring data over a network. In one embodiment, the PMD has a direct wireless connection (e.g., WiFi) or physical connection (e.g., Ethernet) to a network. In alternative embodiments, the PMD is physically (e.g., USB, Smart Card, SD Card, internal bus) or wirelessly (e.g., Bluetooth, IR, RF, UWB) connected to a host device (e.g., a mobile device, a computer, a kiosk, an Internet-enabled TV, a set-top box, etc.) that is, in turn, connected to a network via a variety of mechanisms. In one embodiment, the data to be transferred is stored on the PMD until an appropriate and authenticated network is available, at which time it is transferred via the available connection.

In another embodiment, the PMD transfers (either via physical or wireless connection) data directly to another device whether or not it is connected to the network. The data is either consumed by the device directly or stored until that device is connected to an appropriate and authenticated network.

Embodiments where the data transfer to in two directions (e.g., from and to the PMD) are also disclosed. These transfers could allow aggregation of data, synchronization of settings or personal data, or be used for other purposes.

Embodiments of network web services that are capable of receiving and transmitting the data are described. In many of those embodiments, a repository web service receives and transmits the data as a proxy for a vendor web service.

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; etc.

EXAMPLES OF EMBODIMENTS

FIG. 1 illustrates a PMD 20 connected to a network. In one embodiment, a direct connection 52 is made using a physical (e.g., ethernet) or wireless (e.g., WiFi) protocol. In another embodiment, the connection may be indirect. The PMD 20 may be connected to a host or intermediate device (e.g., a cell phone 31, a computer 31, a kiosk 32, TV or set-top box 33, a game console 34, or other device 35) using a physical (e.g., USB, Smart Card) or wireless (e.g., Bluetooth, UWB, RF, IR) protocol 50. In turn, devices 30-35 are connected to a network using a physical (e.g., ethernet) or wireless (e.g., WiFi) protocol 51.

In one embodiment, PMD 20 stores multiple executable programs designed to run on any operating system (OS) or dedicated host device that it may encounter. That is, PMD 20 stores multiple versions of the same executable programs such that the executable that is designed to operate with the OS, or dedicated host device to which PMD 200 is interfacing, is executed. In addition to the functions performed by executable programs of authentication, authorization, DRM, decryption, decoding, display of content, in one embodiment, there are two distinct, additional functions that these executable programs perform: (1) collecting, encrypting, and queuing the data and (2) securely transferring the data to and from a destination device or web service. This may be an authorized destination device or web service. For purposes herein, the term "data" is distinct from the term "content," where data is information that is primarily collected by the user or by the executable programs, and content refers to the multimedia content that is pre-installed or downloaded to the PMD. In one embodiment, such a download is the result of a transaction.

In one embodiment, since the data collection and data transfer functions are performed at different times, these functions are contained in separate executable programs that are automatically triggered by various events. In another embodiment, these functions are incorporated in one or more executable programs that perform other functions.

In one embodiment, one or more of these functions are executed by the CPU on the host device. In some embodiments, where the capabilities exist, one or more of functions are executed by controller 201 (e.g., a processor, CPU, or other control logic) of FIG. 2 on the PMD. In one embodiment, one or more of these functions are performed by a web service on the network. In one embodiment the functions are performed on different parts of the system containing the PMD and the host.

Figure 2:
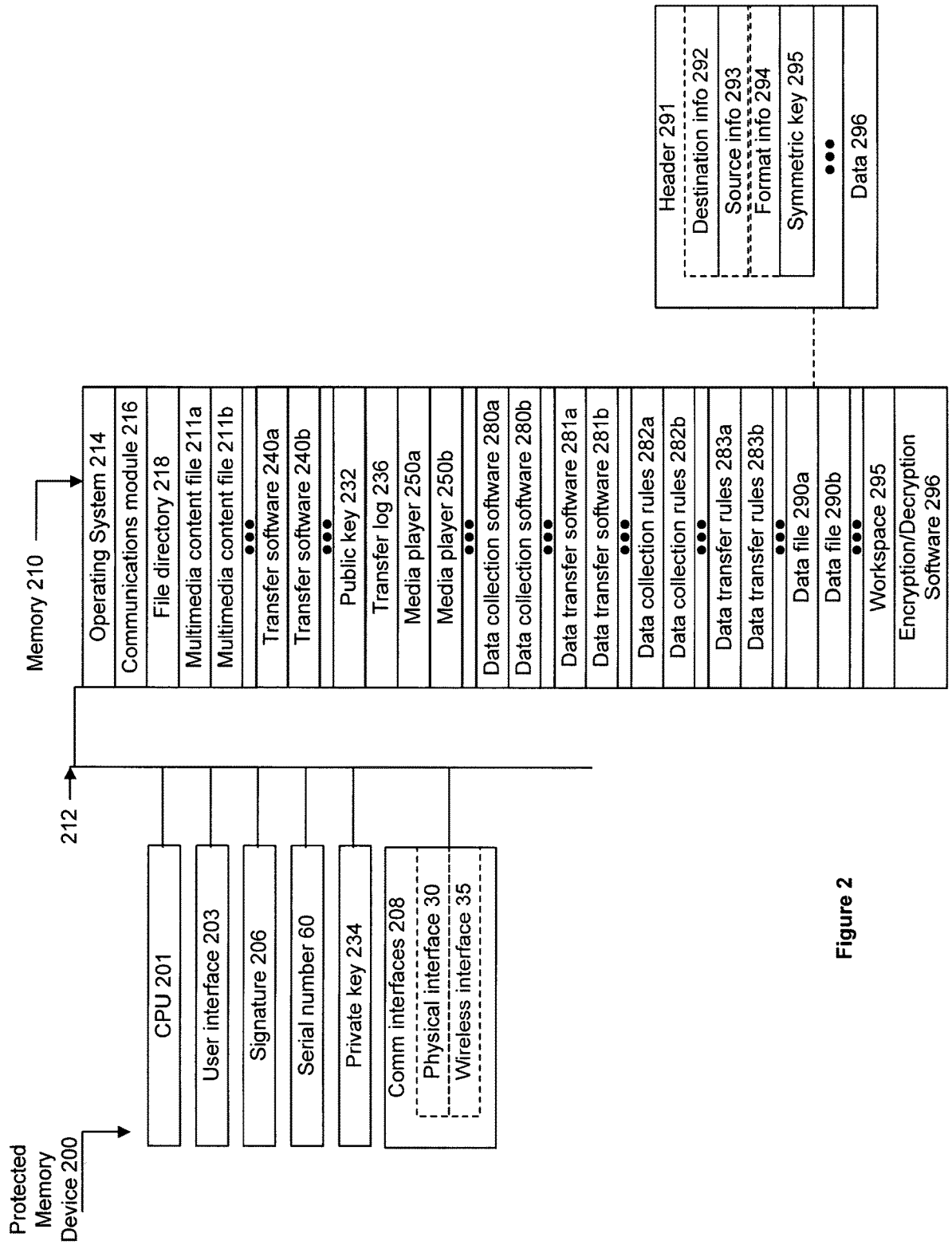
FIG. 2 is a block diagram of one embodiment of a PMD.

FIG. 2 is a block diagram of one embodiment of a PMD. Referring to FIG. 2, the PMD 200 stores aggregated data files 290 corresponding to data automatically collected by PMD 200 without user input to start the collection of such data and in one embodiment without user knowledge of its collection. In one embodiment, the data files consist of the encrypted data 296 and a data header 291. In one embodiment, data header 291 includes at least the symmetric key 295 used to encrypt the data. In another embodiment, data header 291 contains information about the source 293 (e.g., PMD serial number), the format of the collected data 294 (e.g., an XML schema), and/or destination information 292 (e.g., URL, authentication code, public key of the destination, etc.). In one embodiment, part or all of this information is encrypted using a public key where the private key is known only to authorized destinations (e.g., a web service or device). Symmetric key 295 is included in the encrypted portion of header 291.

Memory 210 also stores data collection software 280. In one embodiment, data collection software 280 is a separate executable. However, in another embodiment, all or part of data collection software 280 could be incorporated with other executable programs (e.g., transfer software 240 for transferring content to and from PMD 200, media player software 250 for playing the media content, data transfer software 280, etc.).

Data collection software 280 operates according to a set of rules that specify what data to collect and when to collect that data. Data collection rules 282 are shown as separate in memory; however, in one embodiment, these rules are incorporated directly into data collection software 280 or other executable programs. In another embodiment, data collection rules 282 are a part of the header of content file 211. In one embodiment, multiple sets of data collection rules 282 are included in PMD 200. Multiple sets of data collection rules 282 (e.g., 282a, 282b) allow different types of data collection depending upon the user, application, vendor, content, host, or other interaction the PMD might encounter. In one embodiment, each set of data collection rules 282 results in a unique data file 290. In another embodiment, one set of data collection rules 282 can lead to several data files 290. This may be useful where different sets of data are being collected for different purposes, destinations, vendors, etc. In still another embodiment, different sets of data collection rules 282 share the same data file (e.g., data files 290).

For one embodiment, rules for data transfer (e.g., destination device or network web service and type, cost, and security of the connection) are contained in the content header. In another embodiment, the data transfer rules are contained with data collection rules 282. In yet another embodiment, there are separate data transfer rules files (not shown in FIG. 2), similar to the data collection rules files.

Memory 210 also stores data transfer software 281. In one embodiment, data transfer software 281 is a separate executable. However, in another embodiment, all or part of data transfer software 281 is incorporated with other executable programs (e.g., transfer software 240, media player software 250, data collection software 280, etc.).

In one embodiment, data collection software 280 and/or data transfer software 281 are separate generic resources that are used with specific sets of data collection rules 282 and data transfer rules 283 and with specific sets of triggers that enable data collection software 280 and data transfer software 281 to be invoked numerous times and simultaneously for different purposes (e.g., to collect different analytics for different media content being played).

In one embodiment, data collection software 280, data transfer software 281, and/or their associated triggers may run in the same thread or kernel with other executables or in background threads or kernels.

Figure 3:
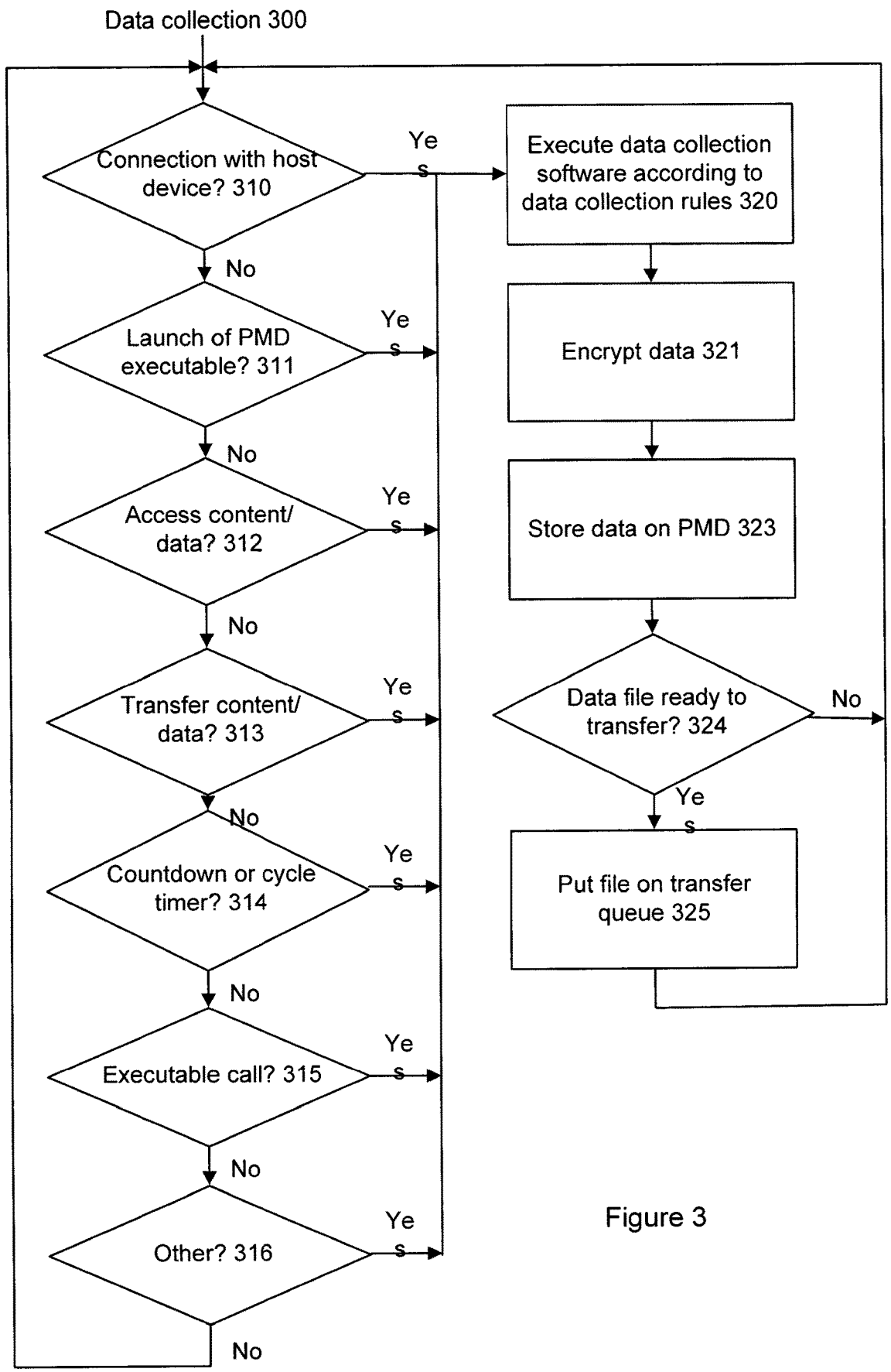
FIG. 3 is a flow diagram of one embodiment of a process for activating and executing data collection.

FIG. 3 is a flow design of one embodiment of a process for using data collection triggers and performing data collection processing. The process is performed by processing logic that may comprise hardware (circuitry, dedicated logic, etc.), software (such as is run on a general purpose computer system or a dedicated machine), or a combination of both.

Referring to FIG. 3, the process includes performing the data collection function after determining whether a trigger has occurred. The data collection functions may be triggered by many different types of events including, but not limited to, one or more of the following: connection with a host 310, launch of an executable on the PMD 311, access to the content or data 312, transfer of content or data to and from the PMD 313, a timing function that periodically launches the data collection 314, a specific call from an executable 315 (e.g., the multimedia player might trigger the data collection when a movie is paused), and other triggers 316.

In one embodiment, each trigger is associated with a different data collection rules set. For example, in one embodiment, there is a rules set for the multimedia player and and different set for content and data transfer.

Once the trigger is activated, the data collection software collects data according to the rules described in the data collection rules 320. Once the data is collected, it is encrypted 321 in a manner well-known in the art using encryption software stored on (or alternatively off, e.g., on a host device) the PMD 323. If, according to the data collection rules, the data is ready for transfer 324, then the file is put in the transfer queue 325.

Referring back to FIG. 2, in one embodiment, memory 210 also includes workspace memory 295 to store data that is being processed or staged. Also, in one embodiment, memory 210 includes encryption/decryption software 296 to perform encryption to produce encrypted data and to perform decryption on encrypted data received by PMD 200. Note that in one embodiment, the host uses software 296 to perform encryption and/or decryption. In another embodiment, the PMD runs software 296 (as well as other software in memory 210).

Figure 4:
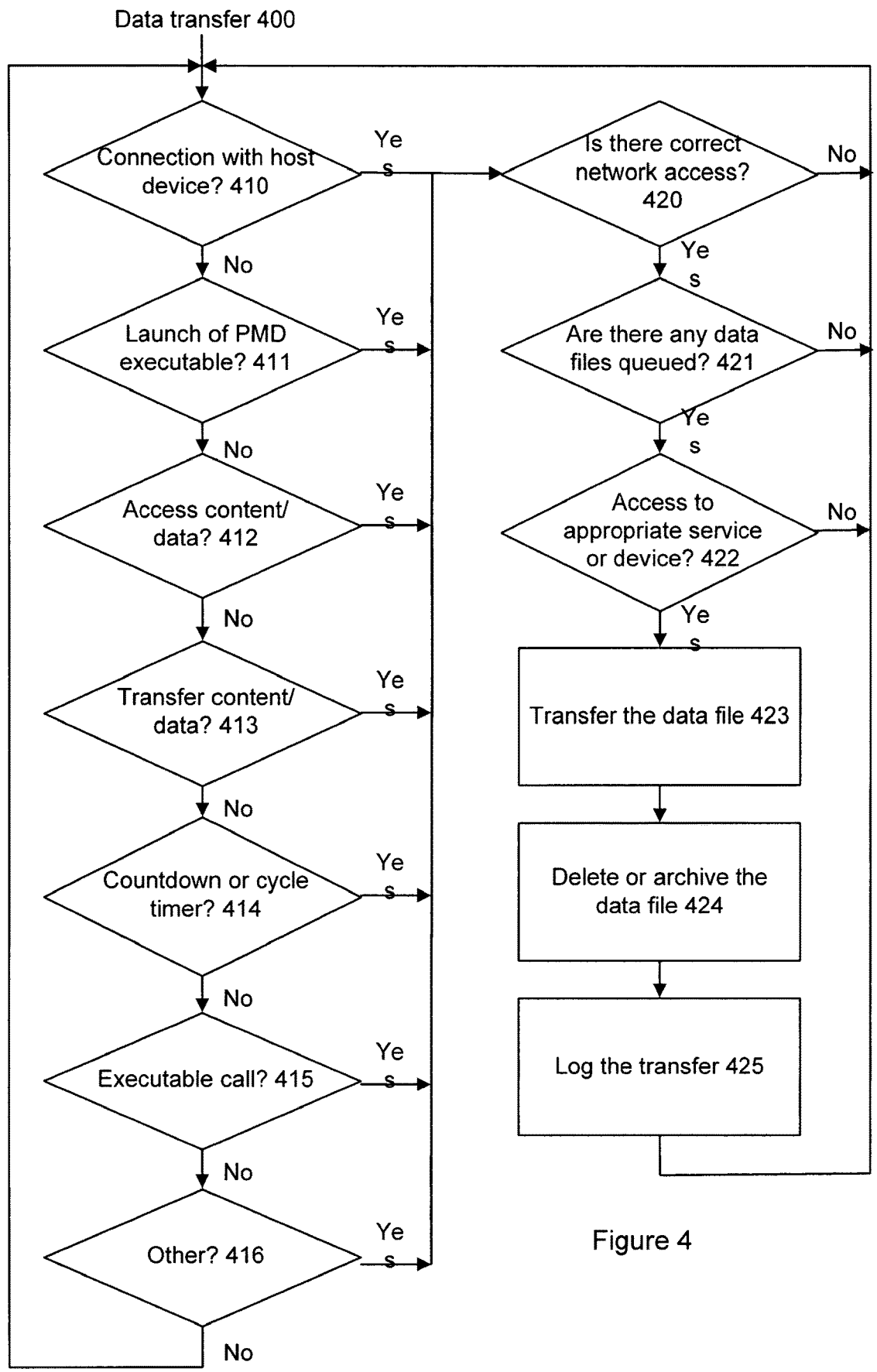
FIG. 4 is a flow diagram of one embodiment of a process for activating and executing the data transfer.

FIG. 4 is a flow diagram of one embodiment of a process for triggering and executing the data transfer software. The process is performed by processing logic that may comprise hardware (circuitry, dedicated logic, etc.), software (such as is run on a general purpose computer system or a dedicated machine), or a combination of both.

Referring to FIG. 4, the secure transfer function is automatically performed whenever an appropriate network connection is perceived by the PMD. In one embodiment, perceiving an appropriate network is a multi-step process. First, a trigger for this function causes the data transfer software to execute. Triggers for the data transfer software may include, but are not limited to, one or more of the following: connection with a host 410, launch of a PMD executable 411, access to either content or data 412, transfer of content or data 413, a timing function that periodically launches the data transfer 414, a specific call from an executable 415 (e.g., the multimedia player might trigger the data transfer when a movie is stopped), and other triggers 416. In another embodiment, this function runs in a background thread, continuously checking for an appropriate network connection.

After the trigger, the CPU (e.g., CPU 201) executing the data transfer software determines if there is appropriate network access 420. The appropriateness of the network is defined by data transfer rules, and include, but are not limited to, parameters such as the cost of communication, bandwidth, security, time required, whether data transfer rules can be synchronized to a new set of rules using the network, etc.

If there is an appropriate network, the CPU executing the data transfer software determines if there are data files in the queue ready for transfer 421.

If there are data files in the queue, the CPU executing the data transfer program determines the destination from the data file and determines from the network if that destination can be accessed 422.

In one embodiment, the data transfer software includes instructions to determine if the data has already been transferred to the destination web service. In another embodiment, the data transfer software includes instructions to query the destination device or web service to check whether there is data to be transferred from the web service to the PMD.

Finally, the CPU executing the data transfer software executes the transfer 423 with a return confirmation that it was completely successful and logs the transfer 425. Thereafter, depending on instructions in the data transform program, the CPU may or may not be deleted 424.

There could be one or more web services with which the PMD communicates. These services can be pre-programmed into the executable programs, or could be included in data collection rules 282.

In one embodiment, when the PMD is plugged into a host, data collection software and data transfer software are automatically triggered to cause the host to search for a service, such as a web service or a network, download software to do analytics, execute the software to do the analytics and send back the results immediately without the need to queue the results for any appreciable length of time. Thus, analytics software is run as soon as the PMD receives the software (and the PMD, host or other device runs the PMD software) and results from that execution are sent immediately after being created.

Data transfer rules 202 might allow for data to be transmitted to intermediate devices or network sites, rather than the final destination site. These intermediate devices act as proxies for the PMD, and will transfer the data to the destination web service when they are appropriately connected. In one embodiment, the PMD transfers the data to a number of devices to increase the likelihood and decrease the latency for transferring the data to the destination web service. This increase in likelihood is based on the likelihood such devices interface with the destination before or more often than the PMD.

In one embodiment, the destination is the host device rather than a network web service.

The data collection software is executed on the appropriate device (e.g., host device, PMD, web service). In one embodiment, the data collection software is run on one or more devices, according to the data collection rules, to collect all sorts of data from the device it is running on. In another embodiment, the data collection software runs on one or more devices and collects all sorts of data from any and all devices in the system. That is, the data collection software may be executed on different devices to collect data from different locations. This includes data accessible at the PMD, at a host device, and/or over a network. Data can be generated by users interacting with execution programs (e.g., games, forms, settings), executable program state (e.g., media player playing specific content, text editing), and/or analytics that are collected by the data collection software. These data can be collected for multiple data files at the same time.

In one embodiment, the data collection rules and triggers are dynamic and are re-defined at times by the data collection and transfer routines, or by a control routine in connection with a data transfer function.

The data transfer software is executed on the appropriate device (e.g., host device, PMD). In one embodiment, the data transfer software may run on one or more devices, and transfers all sorts of data to any and all devices. In other embodiments, the data transfer software runs on one or more devices and transfers all sorts of data to any and all devices in the system. That is, the data transfer software may be executed on different devices to transfer data to different locations. This includes data accessible at the PMD, at a host device, and/or over a network.

The data collection software and data transfer software may be stand-alone programs, incorporated into other programs, or kernel programs that run continuously.

In one embodiment, the data collection rules and/or the transfer data rules can be modified by the user. In some embodiments, a user interface is provided on the host device, PMD, or web service to enable the user to modify these rules.

In one embodiment, the data collection software collects analytics data over time and aggregates it into one or more data files. In one embodiment, the data is aggregated into multiple files based on the destination of the analytics data. For example, in the case of movies, data may be collected for different movie studios as well as outside organizations, and then the data files created for those organizations are subsequently sent to those organizations.

Examples of Collected Data

Examples of analytics generated from the PMD include, but are not limited to, the following:
  Content files on the PMD;
  History of playing (how many viewings, when and where paused, etc.);
  Rules for the content;
  History of transactions, downloading, transferring the content files;
  Extra content on the PMD and its history (e.g., trailers for movies);
  Other files on the PMD and their history; —Directory structure;
  Serial number of the PMD;
  Executables on the PMD and the history of usage;
  User, vendor, and/or host settings stored on the PMD;
  History of analytical data uploads and downloads;
  Web services that the PMD has or will interact with;
  Time and date;
  Transfer log (for content transfer); and
  Other information.

Examples of analytics generated from the host device the PMD is connected to include, but are not limited to, the following:
  Type of host, serial number, production date;
  Host address book entries;
  Host media list;
  Location(s) specifying where the device has been (e.g., GPS locations);

Other applications on the host;

Analytics stored on the host;

Phone, text messaging, web browsing, and other communication history;

Directory structure and file information on the host device; and

Other information.

Examples of analytics generated from the network the PMD is connected to include, but are not limited to, the following:

Server and service ID;

Type of interaction;

Transactional keys and information;

Social networking; and

Other information.

In another type of data collection, the user creates data for rating a movie, other content, or service, or writes a review, or leaves a comment. This data could be uploaded and automatically routed to the correct web service using the technique described herein.

Generating this type of data requires an executable that offers a data entry user interface. This executable could be located and/or executed on the PMD, in the same way other executables are.

In another example, an executable program allows the user to automatically backup or archive data located on either the host or the PMD. This allows a user to interact with free form data, e.g. their own documents, images, movies, audio, or other data. In one embodiment, the collection and communication elements described herein are used to automatically synchronize or transfer data collected on the PMD to a network web service that performs the backup or archive function.

In another example, the data being collected is derived from specific executable and content files. Applications with functions like transaction, games, media players, passwords, and other state data may allow critical tracking functions and enhance the user experience by saving the state. In one embodiment, software on the PMD allows these PMDs to be synchronized, updating the state across multiple instances. One example is a multiple participant game, where the data is entered and then opportunistically synchronized at a later time.

Figure 5:
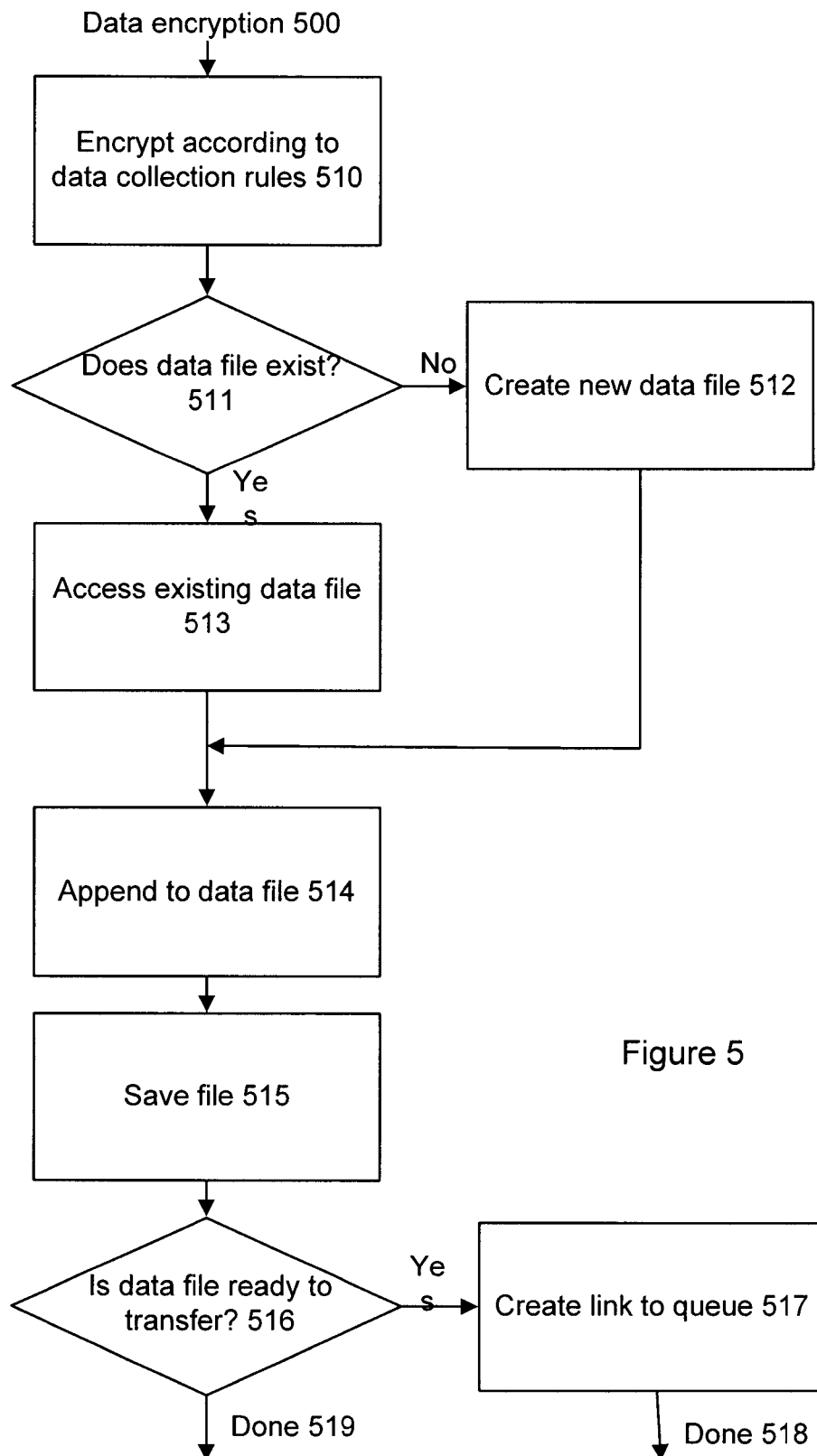
FIG. 5 is a flow diagram of one embodiment of a process for data encryption.

FIG. 5 is a flow diagram of one embodiment of a process for encrypting the data files. All the collected data is encrypted according to the data collection rules. In one embodiment, a symmetric key (e.g., AES, DES) is used. In another embodiment, a streaming encryption is used. In still another embodiment, a public key is used. In one embodiment, if a public key is used, it comes from the same sources as the header encryption described below.

The encryption computation can be done on the host device or, if the capability is present, on the PMD. This may be performed using encryption software stored on the PMD.

In one embodiment, data is encrypted progressively; that is, a unit of data is encrypted and appended to the data file. In another embodiment, the data is encrypted all at once. In one embodiment, one key is used for an entire data file. In another embodiment, multiple keys are used. In one embodiment, if more than one key is used, all the keys are contained in the data header. Also, a description of which parts of the data file are encrypted with which keys is included. Such information may be included in the data header.

According to the data collection rules, there can be one master data file, a data file associated with every content file or executable file, or files for each instance of data or data collection time, etc. If there are multiple files, it is recommended, but not required, that each file have a unique symmetric key. It is also recommended, but not required, that a unique key is used each time a data file is transferred.

After the data is encrypted, it is appended to an existing file 513, 514 or a new file is created 512. The encrypted data file is stored on the PMD 515. If, according to the data collection rules, the data file is ready for transfer 516, it is placed in queue 517. This queue could be a location in memory where the entire data file is stored or it could be a linked list to all the queued data files.

In one embodiment, the data is collected and stored securely (either temporarily encrypted or in a private area of memory) on the PMD and encrypted (or re-encrypted) immediately prior to transfer.

In one embodiment, the data file is encrypted using the public key of the destination web service or device. In another embodiment, the data file is encrypted with a symmetric key that is stored in the data header, and that data header is encrypted with the public key of the destination web service or device. In yet another embodiment, both the data file and the data header are encrypted with the public key of the destination web service or device It is necessary for the PMD to have access to the public key of the destination web service or device for encryption of the data header and/or data file. These keys can be delivered to the PMD in a number of ways. In one embodiment, the public key (or keys) are installed at the factory or during a kiosk-style transaction in the data collection rules. In another embodiment, the key (or keys) are contained in the content headers of the content files.

Figure 6:
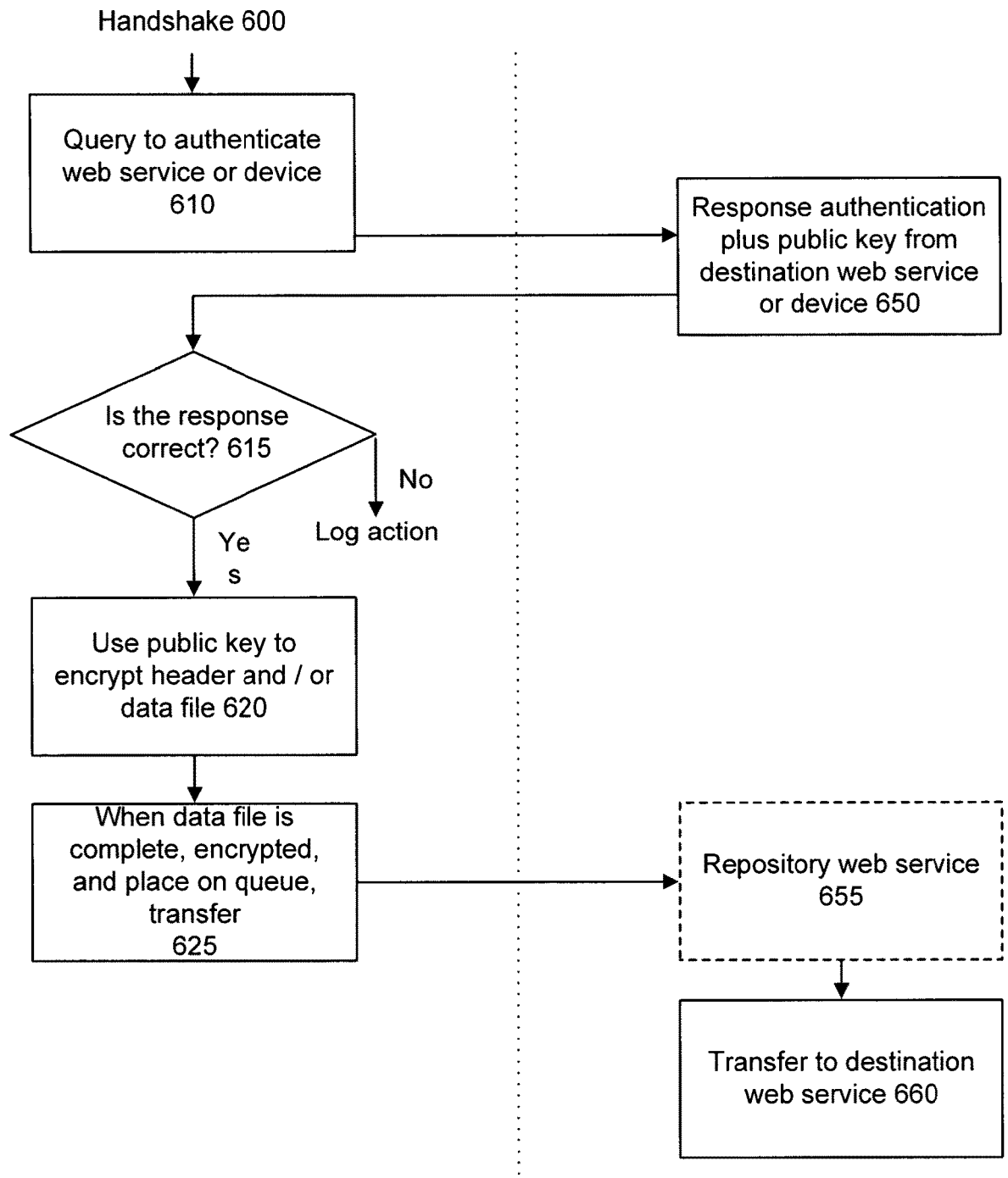
FIG. 6 is a flow diagram of one embodiment of a process for public key exchange.

In still another embodiment, the key is delivered to the PMD via a network in response to a request from the data transfer software. Note that the actual computation and/or network exchange can be performed on the host device or, if the capabilities exist, on the PMD itself. In some embodiments, this request and response comes after the PMD and the web service (or device) have authenticated each other. FIG. 6 is a flow diagram of one embodiment of a process showing this interaction.

Referring to FIG. 6, the device requests authentication and a key from the web service or device 610. In another embodiment (not shown in FIG. 6), this request is triggered by the web service. The response from the web service device 650 included the authentication information and the web service or device's public key. The PMD authenticates the response. If it is valid 615, the key is used to encrypt the data file and/or data header. When the data file is ready for transfer, according to the data collection rules, it is queued 625 and eventually transferred.

Since the data file is encrypted and the key is encrypted in the data header using the public key of the destination web service or device, there is no need to use a secure communication channel to exchange the data file. In fact, the data files can be transmitted and stored in openly accessible channels and sites. The maintenance of security is the responsibility of the web service or device that manages the private keys that correspond to the public keys.

Figure 7:
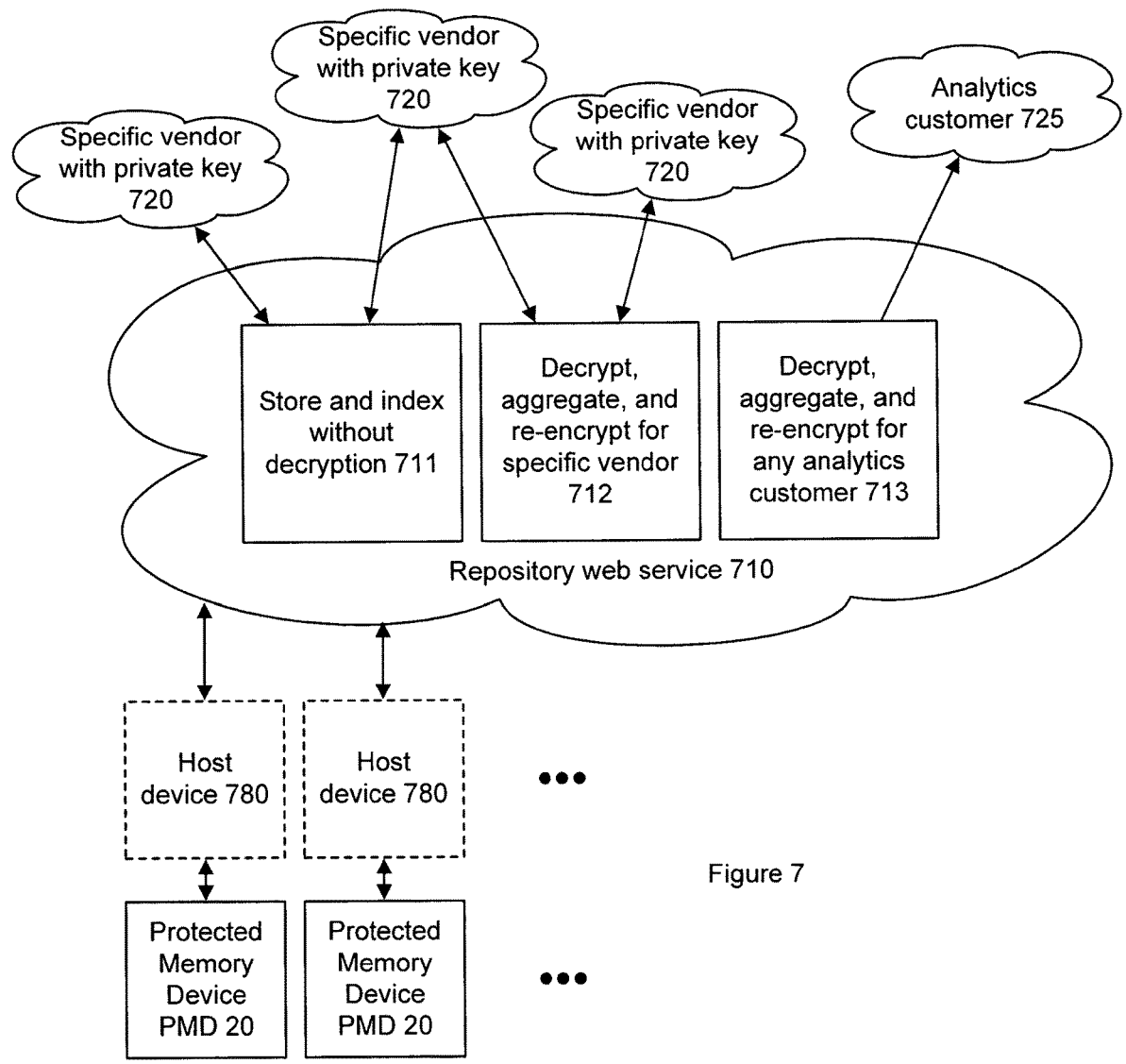
FIG. 7 illustrates one embodiment of data flow to a repository web service.

FIG. 7 shows the data flow when a central repository site acts as a proxy for any number of possible vendor sites or web services. With this embodiment, some or all of the data files can be transferred to one web service 710 from the PMDs 20, possibly via a host device 780.

The repository site can perform a number of intermediate services on the data files. In one embodiment, the repository site offers the data files and an index of the public keys used so that the destination web service access the correct data 711. Alternatively, the repository web service sends a message to the destination web service indicating that one or more data files are available. No processing is done on the data files and there is no need for additional security (although an embodiment might require login authentication or SSH type interaction) because the data files are secure. Note that, in one embodiment, the public key of the destination web service is used directly by the PMD for encrypting the data files and/or data headers. Therefore, only the destination web service, with exclusive access to the corresponding private key, can decrypt the data.

In one embodiment, the destination web service also prepares data files to be downloaded to the PMD. Either the destination web service private key is used or the public key of the PMD is used to encrypt the data file and/or data header. In such a case, the PMD uses decryption software stored or accessed by the PMD to decrypt the information.

In one embodiment, the repository site collects all of the data for a specific vendor 712. In one embodiment, the data files are decrypted and the data is analyzed and aggregated into a master report, and this report is then re-encrypted using the public key of the destination web service and is available via an of the public keys used so that the destination web service access the right data. In an alternative embodiment, the repository web service sends a message to the destination web service indicating that one, or more, reports are available. There is no need for additional security (although some embodiments might require login authentication or SSH type interaction) because the data files are secure. Note that, in one embodiment, the public key of the repository web service, not the destination web service, is used by the PMD for encrypting the data files and/or data headers. Therefore, only the repository web service, with exclusive access to the corresponding private key, can decrypt the data.

In one embodiment, the destination web service also prepares data files to be downloaded to the PMD and gives those data files to the repository web service. The repository web service re-encrypts the data files and/or data header either using the repository web service private key is or the public key of the PMD.

In yet another embodiment, the repository site uploads all of the PMD data, decrypts it, and creates aggregated reports for a any customer of the repository site 713. Note that in this embodiment the public key of the repository web service is used by the PMD for encrypting the data files and/or data headers. Therefore, only the repository web service, with exclusive access to the corresponding private key, can decrypt the data.

In an embodiment where a repository is used, the repository service manages the public key given to the PMDs. According to the authentication and purpose derived in the initial handshake, the repository will offer a unique public key from a destination web service or from repository site. The repository tracks the usage and response to these keys. Alternatively, the repository can offer these keys to the host device or to the manufacturer of the memory device (who uses it pre-loading content).

In one embodiment, the repository web service logs all actions related to data files and reports.

Usage Scenarios

To illustrate the depth, breadth, and versatility of embodiments of the invention, the following system examples are offered. These are intended to illuminate, not limit, the utility of embodiments of the invention. In each of these usage examples, the types of data collected and the rules may change depending on the content, rules and triggers.

Movie Distribution

When PMDs are used for movie distribution, analytical information about the viewing of these movies can be collected. Such information may be valuable for the owner of the content and others. This example demonstrates one possible usage scenario of using PMDs to collect analytical information for this purpose.

The movie content files, along with the player executables suitable for playing the content on a number of different devices and OSs, are pre-loaded, downloaded, or side-loaded (e.g., from a Kiosk device) onto the PMD. When the PMD is connected to a host device for viewing, the appropriate player software executable is automatically launched on the host device, performs the necessary authentication and authorization protocols, decrypts the DRM, decodes the movie content file and presents the data to the display and speakers. This process has been described in U.S. Pat. No. 7,508,943, titled "Multimedia Storage Systems and Methods," and filed May 17, 2004, the entirety of which is incorporated herein by reference.

In this scenario, in one embodiment, the data collection software functions are incorporated with the player executable programs. Thus, the data collection is performed by the host device while the player executable programs are running. Note that this is not required, and the data collection software may be an executable separate from the player executable programs.

In this scenario, in one embodiment, the data collection rules for the specific content (e.g., movie) are contained in the content header of the content file and specify the following:

data collection triggers (start of movie, pause movie, restart movie, end movie)

data collection (trigger (start of movie))=movie title, PMD serial number, other movies on PMD, log history (e.g., viewing, transfers), host device type, host device serial number, GPS location, other data on host device, network available, time data collection (trigger (pause movie, restart movie, end movie))=function (pause, restart, fast forward, reverse, end), time capture all data between one trigger instance (e.g., start, end)

create data file with public key (<public key of movie vendor>)

queue for (<URL of movie vendor web service>)

In one embodiment, the transfer data software executable, in this example, is separate from the data collection functions and the player executables. Like the player executables, there are several versions of the transfer data software executables capable of playing on a number of different host devices and OSs. The transfer data software executable launches automatically when the PMD is connected to the host device. In one embodiment, his software runs as a thread or kernel in the background on the host device.

The transfer data rules are pre-loaded, downloaded, or side-loaded into the memory of the PMD. In one embodiment, there is only one set of rules, for this example, for all the different content files on the PMD and the rules are the following:

transfer data triggers (power-up PMD, timed test for network, new item in the transfer queue, timed test for PMD)

when the trigger (timed test for PMD) indicates there is no PMD quit executable when other triggers, transfer data if and only if: 1) network is available; 2) data in the transfer queue; 3)

destination of the data is accessible with this network; 4) network traffic is acceptable (e.g., not overloaded); and 5) network access is no cost to the user If all of the conditions of a data transfer trigger are satisfied, the data on the queue is transferred directly to the vendor's web services as specified in the data collection rule. In one embodiment, the data collection rules specify where to transfer the queued data. For example, the data collection rules specify a URL or other network address which is put in the header of the data file containing collected data. Subsequently, the data transfer software looks to the header to determine where to send the data.

If desired, in one embodiment, the vendor's web service responds to the uploaded data by downloading new content. This content might be trailers for new movies, advertising and/or coupon offers, a new movie, or other entertainment content.

Note that the above example, and variations of this example, could be used for all sorts of content distribution (e.g., newspapers, magazines, books, audio, music, speeches, seminars, lectures, instructional materials, etc.).

Health Information

In another usage scenario, the PMD is used to store and transfer confidential health care records for an individual. These records are required by government regulation in many countries to be protected. Protection, in this example, not only includes encryption but also tracking the access, viewing, and transfer of the data. For this example, it is assumed that a first health care organization gives a PMD to a patient or allows the patient to have the health care records downloaded to a PMD they possess. This patient may download, view, and transfer the data to a second heath care organization (provided that organization is authorized by the first health care organization or by a central authority).

In one embodiment, the health content files, along with the appropriate health care executables suitable for viewing, manipulating, or rendering the content are pre-loaded, downloaded, or side-loaded from a office kiosk device or computer onto the PMD. In an alternative embodiment, the health content files and the health care executables can be downloaded using the transfer data process described herein.

In one embodiment, the PMD has an on-board CPU and other computing functions capable of performing all the software functions described in this scenario, and. when the PMD is connected to a host device only power and I/O capabilities of the host (e.g., display, user interface, network access capabilities) are utilized. Furthermore, there need be no more than one health care executable per content file (though this is not a requirement). In some cases, the content files can share one health care executable. In one embodiment, the health care executable identifies a single player appropriate for the content (e.g. image, text, video, audio). In another embodiment, the health care executable is a dynamic or interactive program working on the content file (e.g., a drug interaction program working on a database of prescribed drugs). In one embodiment, there are settings, status, profiles, and/or other interactive data collected and maintained by the health care executables and stored securely on the PMD.

In one embodiment, the data collection software executable and the transfer data software executable are combined into a single program that runs in the background on the PMD whenever it is powered up. Note that they could be separate executables.

In one embodiment, there is only one data collection rules set stored in the PMD memory, and the rules specify the following:

data collection triggers (power up, launch or quit of health care executable, alteration of status-settings-profile-log files, access or display of health content, transfer of health content)

data collection (trigger (power up, launch or quit of health care executable))=PMD serial number, log history (e.g., viewing, transfer, interaction), host device type, host device serial number, GPS location, other data on host device, network available, time data collection (trigger (alteration of status-settings-profile-log files, access or display of health content, transfer of health content))=viewing log history, transfer log history, time capture all data between transfer data triggers (as described below)

create data file with public key (<public key of health care organization vendor>)

queue for (<URL of health care organization web service>).

For this example, in one embodiment, there is only one transfer data rules set stored in the PMD memory. In this case, the rules specify the following:

transfer data triggers (power-up PMD, timed test for network)

when transfer data triggers occur, transfer data if and only if: 1) network is available; 2) data collection function has data for transfer; and 3) destination of the data is accessible with this network.

In one embodiment, if all of the conditions of a transfer data trigger are satisfied, the data is created by the data collection function and transferred directly to the health care organization's web services. In one embodiment, the health care organization's web service responds to the uploaded data by downloading new health content.

Note that the above example, and variations of this example, could be used for all sorts of content distribution (e.g., financial data, government data, legal data, scientific data, diplomatic data, interactive games, etc.).

Private Content

Another example of the use of techniques described herein is the use of PMDs for private content (e.g., whatever the owner of data wants to put on a PMD).

In this example, in one embodiment, a number of private content executables are pre-loaded, downloaded, or side-loaded (e.g., from a Kiosk device) onto the PMD. These executables not only suitable for operating on many different devices and OSs, but there could be several sets of private content executables each corresponding to a different private content web service. (Examples of private content web services might be special versions of popular file sharing services, e.g., Google Docs, Box.net.) In one embodiment, when the PMD is connected to a host device, the appropriate private content executables are automatically launched on the host device and offered as applications on that device. In one embodiment, when the user utilizes that executable, the necessary authentication and authorization protocols and the content is decrypted (for access or viewing) or encrypted for storage (and/or eventual transfer to the web service), if any. Note that this content interaction can all be performed while the PMD is disconnected from a network.

In this example, in one embodiment, the data collection functions, and most of transfer data functions are executed at the web service itself. For security, in one embodiment, the connection between the host device and the network is a secure one, e.g. SSH. In one embodiment, the data collection rules for the specific private data executable are contained at the web service, and the rules specify the following:

data collection triggers (ping from the PMD transfer data function)

data collection triggers=PMD serial number, PMD directory listing, log history, host device type, host device serial number, GPS location, other data on device, network available, time, encrypted content files for upload, request for encrypted content files for download capture all data of one trigger instance.

In one embodiment, the transfer data software executables and the transfer data rules, in this example, are contained in the private content executable, and the functions are limited to triggering the private content web service. The uploading and downloading of content and analytical data is performed by the private content web service.

In one embodiment, the transfer data rules are the following:

transfer data triggers (launch private content executable, access-alter-add content)

when triggers, inform the web service if and only if: 1) network access to private content web service is available.

Once the private content web service is informed, the interaction is executed by that web service. Therefore, different web services can have different interactions.

Note that the above example, and variations of this example, could be used for all sorts of web service interaction (e.g., financial, government, legal, scientific, diplomatic, interactive games, etc.).

For example, in an exemplary gaming environment, the data collected includes but is not limited to, the skill level, character type, possessions, tools, alliances, opponents, enemies or virtual map location of a particular player. This and other status information may specify what has been attained or accomplished. In this example, the analytics for a player is stored while playing a game and may be retrieved by that player if the PMD is coupled to another game computer or game playing device. Pre-set triggers optionally may transfer the collected data at the start of a game, during game play or at exit and may include information about a particular player, the player platform used, game play, or even information about opponents, allies or others involved in the game play process. In one embodiment, storing status into the PMD allows a user to continue a game where they left off, and the transfer of status is from the host executing the game back to the PMD. The status could be transferred to another (remote) location, such as web service. This may occur when playing a game against or with players at other network locations.

In another example, in sports, performances, entertainment, or other events, statistical data corresponding to, or associated with, the event or participants (e.g., athletes, performers, etc.) may be accessed and displayed to a viewer or audience. Analytical data may be collected as to the content that is viewed or accessed, while experiencing the event. For example, data describing the types of statistics retrieved by a viewer is collected. In a specific case, when a viewer watches an Olympic event, analytics are collected corresponding to content that is consumed such as, for example, content relating to statistics of the particular players, countries, teams, or history and these are transferred following a pre-defined set of rules for data collection, and triggers as described above.

In additional examples, data is collected when users interact with particular systems such as intelligent appliances, cars, and other systems. Data may be collected in connection with a recipe book or a home refrigerator describing user food preferences, consumption patterns or usage patterns. For automobiles, driving distances, driving patterns, maintenance, driving times and other usage information is collected.

In general, consumer usage and consumption patterns are collected by predefined rules and triggers, and transferred by pre-defined rules and triggers. Optionally, these rules and triggers are dynamic and may be re-defined at any time by the data collection and transfer routines, or by a control routine in connection with a data transfer function.

Also note that any or all of these examples could be executed simultaneously on the same PMD.

Additional PMD Embodiments

In one embodiment, the PMD stores digital multimedia content file. In one embodiment, this content file is encoded. Accordingly, the PMD, when storing the content file on a target storage medium, may further store thereon a decoding data set that, when executed, operates to decode the content file, thereby enabling presentation of the content file. Techniques by which content files and associated decoding data sets may be created and employed by, for example, the PMD are described in commonly owned U.S. Pat. No. 7,508,943, titled "Multimedia Storage Systems and Methods," and filed May 17, 2004, the entirety of which is hereby incorporated by reference.

The non-volatile memory of the PMD may include multiple player/decoder program files (executables) and may also include multiple decryption program files. Each player/decoder program is a different version of the same decoder software and is compatible with a respective different type of electronic system, and/or is compatible with a respective different operating system employable by a host system such as host 50 (e.g., a client device). These players may be multimedia players. For instance, one multimedia player may be compatible with a host electronic system that runs a Java® operating system, while another multimedia player may be compatible with a host electronic system that runs a Windows® operating system, and so on. Accordingly, in some embodiments, the non-volatile memory of the PMD stores multiple multimedia players that are compatible with many different commercially available host electronic systems, enabling the removable non-volatile memory storage device to cooperate with a wide variety of devices equipped to present visual and/or auditory information.

Moreover, the decoder, of which each player/decoder program is a different version, corresponds to the scheme used to encode a file (or data set), such as a digital audio file or digital multimedia content file, and is thus required in order to decode the file (or data set). Similarly, each decryption program is a different version of the same decryption software and is compatible with a respective different type of electronic system, and/or is compatible with a respective different operating system employable by an electronic system such as host 50. Moreover, the decryption software, of which each decryption program is a different version, corresponds to the scheme used to encrypt the file (or data set), and is thus required in order to decrypt the file (or data set).

The PMD may otherwise provide digital rights management (DRM) and content protection for all the contained and dispensed content by employing systems already in place for content protection/DRM such as that standardized by Internet Groups and the International Telecommunications Union (ITU). Every data set (content file) dispensed will contain its own serial number so that unauthorized use may be traced and prosecuted. The serial number cannot be changed without at the same time erasing as least some of the content of the data set. The data sets (e.g., digital multimedia content files) transmitted to the customer's storage media device may also be constrained to play from that device only. If the attempt is made by the customer to copy the media onto any other storage than that originally dispensed onto, the media will not play.

For example, a content anti-copy mechanism may be used when writing content to memory cards, whereby the serial number of the memory device (PMD) is utilized. This process requires that the serial number of the card be read by the PMD and then written onto the memory device as part of the data set, as well as loaded with the data player/decoder on the memory device.

Should the memory device data be subsequently copied on to another medium such as a second programmable flash card, the files would not play since the new card would have a different serial number from the original. Thus, the memory device would act as a dongle preventing play of the data by its own self-contained player. Use of video players on a playing device (e.g., cell phone) would not permit this manner of anti-copy protection.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

We claim:

1. A wireless apparatus comprising:
   a WiFi wireless interface for communicably connecting to a network via a WiFi connection;
   a memory to store a content file associated with a first media content and a plurality of software executables including a data collection executable and a data transfer executable; and
   a controller coupled to the memory to execute
      the data collection executable to cause analytics data related to the first media content to be collected and stored in data files in the memory according to a set of data collection rules for the first media content, wherein execution of the data collection executable causes creation of a plurality of data files comprising a first data file as specified by the set of data collection rules specifying the analytics data to be collected and a time at which the analytics data is to be collected, wherein the data collection executable is to invoke software to start collecting the analytics data by occurrence of a connection between a host and the apparatus and access to and/or transfers of the first media content,
      the data transfer executable to cause the first data file comprising the collected analytics data and a data header comprising a first key used to encrypt the collected analytic data to be transferred to a destination device at a location external to the apparatus via the wireless interface in response to determining one or both of existence of network access and presence of a network connection, wherein the data header is encrypted with a second key that is a public key of the destination device.

2. The apparatus defined in claim 1 wherein the data transfer executable, upon execution, determines whether the destination device can be accessed for collected data.

3. The apparatus defined in claim 1 wherein the data transfer executable, upon execution, causes collected data to be transmitted to the destination device when the interface is connected to a host system.

4. The apparatus defined in claim 1 wherein the data to be collected includes data regarding user interaction with the non-volatile memory device to access and use the content file and to execute one of the plurality of executables.

5. The apparatus defined in claim 1 wherein the data to be collected is generated by and includes data tracking of at least one user interacting with the content file and at least one of the plurality of executables.

6. The apparatus defined in claim 1 wherein the data to be collected is generated according to analytics rules.

7. The apparatus defined in claim 1 wherein the data collection executable, in response to executing, causes data to be collected automatically without user input.

8. The apparatus defined in claim 1 wherein the data transfer executable is stored within a content file.

9. The apparatus defined in claim 1 wherein the data transfer executable, in response to executing, causes collected data to be transmitted to the destination device via a web repository.

10. The apparatus defined in claim 1 wherein the data collected comprises one or more selected from a group consisting of private data, response information, ratings information, review information, and state data associated with content stored in the memory.

11. The method defined in claim 1 wherein execution of the executables causes at least one of the executables to be transferred to, via WiFi, and executed by a system external to the device, causing analytics to be generated on the system that obtained by the device in response to execution of the data transfer executable.

12. A method comprising:
   receiving an indication via a WiFi interface that a host system is interacting with data stored in a memory of a device that is storing a content file associated with a first media content;
   executing, on the device, a plurality of software executables including a data collection executable and a data transfer executable,
      the data collection executable to cause analytics data related to the first media content to be collected and stored in data files in the memory according to a set of data collection rules for the first media content, wherein execution of the data collection executable causes creation of a plurality of data files comprising a first data file as specified by the set of data collection rules specifying the analytics data to be collected and a time at which the analytics data is to be collected, wherein the data collection executable is to invoke software to start collecting the analytics data by occurrence of a connection between a host and the apparatus and access to and/or transfers of the first media content,
      the data transfer executable to cause the first data file comprising the collected analytics data and a data header comprising a first key used to encrypt the analytic data to be transferred to a destination device at a location external to the apparatus via the wireless interface in response to determining one or both of existence of network access and presence of a network connection, wherein the data header is encrypted with a second key that is a public key of the destination device; and transferring the collected data via the WiFi interface.

13. The method defined in claim 12 wherein the data transfer executable, upon execution, determines whether the destination device for collected data can be accessed.

14. The method defined in claim 12 wherein the data transfer executable, upon execution, causes collected data to be transmitted to the destination device when the interface is connected to a host system.

15. The method defined in claim 12 wherein the data to be collected includes data regarding user interaction with the non-volatile memory device to access and use the content file and to execute one of the plurality of executables.

16. The method defined in claim 12 wherein the data to be collected is generated by and includes data tracking of at least one user interacting with the content file and at least one of the plurality of executables.

17. The method defined in claim 12 wherein the data to be collected is generated according to analytics rules.

18. The method defined in claim 12 wherein the data collected comprises one or more selected from a group consisting of ratings information and review information associated with content stored in the memory.

19. The method defined in claim 12 wherein the executables comprise health care executables for viewing, manipulating, and rendering health care related content, including health care records, in the memory, and wherein the data collecting executable comprises tracking software for tracking access, viewing and/or transfer of the health care related content.

* * * * *